(12) United States Patent  
Nishizaki et al.

(10) Patent No.: US 9,583,355 B2  
(45) Date of Patent: Feb. 28, 2017

(54) PLASMA PROCESSING APPARATUS AND PLASMA PROCESSING METHOD

(71) Applicant: Panasonic Corporation, Osaka (JP)

(72) Inventors: Nobuhiro Nishizaki, Osaka (JP); Atsushi Harikai, Osaka (JP); Tetsuhiro Iwai, Osaka (JP); Mitsuru Hiroshima, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/259,450

(22) Filed: Apr. 23, 2014

(65) Prior Publication Data

US 2014/0335696 A1    Nov. 13, 2014

(30) Foreign Application Priority Data

May 9, 2013   (JP) ................................ 2013-099291

(51) Int. Cl.
*H01L 21/302*   (2006.01)
*H01L 21/3065*  (2006.01)
(Continued)

(52) U.S. Cl.
CPC .... *H01L 21/3065* (2013.01); *H01J 37/32715* (2013.01); *H01L 21/31138* (2013.01); *H01L 21/78* (2013.01)

(58) Field of Classification Search
CPC .......... H01J 37/32623; H01J 37/32633; H01J 37/32642; H01J 37/32715; H01L 21/3065;
(Continued)

(56) References Cited

U.S. PATENT DOCUMENTS 5,389,182 A  *  2/1995  Mignardi ....................... 156/701
5,421,401 A     6/1995  Sherstinsky et al.
(Continued)

FOREIGN PATENT DOCUMENTS

JP   2009-094436   4/2009
JP   2012-248741  12/2012
WO  2012/133585  10/2012

OTHER PUBLICATIONS

U.S. Office Action issued Apr. 21, 2015 in related U.S. Appl. No. 14/259,559.
(Continued)

*Primary Examiner* — Nadine Norton
*Assistant Examiner* — Christopher Remavege
(74) *Attorney, Agent, or Firm* — Wenderoth, Lind & Ponack, L.L.P.

(57) ABSTRACT

The plasma processing apparatus is provided with a chamber 11, a plasma source 13 which generates plasma inside the chamber 11, a stage 16 which is provided inside the chamber 11 and places a carrier 5 thereon, a cover 31 which is arranged above the stage 16 to cover a holding sheet 6 and a frame 7 and has a window 33 which is formed on a central part thereof to penetrate the cover 31 in the thickness direction, and a drive mechanism 38 which changes the position of the cover 31 relative to the stage 16 between a first position which is away from the stage 16 and allows the carrier 5 to be placed on and removed from the stage 16 and a second position which allows the cover 31 to cover the holding sheet 6 and the frame 7 of the carrier 5 placed on the stage 16 and a substrate 2 held on the holding sheet 6 to be exposed through the window 33. The window 33 of the cover 31 allows an area of the substrate 2, the area being located on the inner side with respect to an outer edge area of the substrate 2, to be exposed therefrom.

2 Claims, 4 Drawing Sheets

(51) Int. Cl.
  *H01J 37/32* (2006.01)
  *H01L 21/78* (2006.01)
  *H01L 21/311* (2006.01)

(58) Field of Classification Search
  CPC ......... H01L 21/31138; H01L 21/67092; H01L 21/67132; H01L 21/68735; H01L 21/78
  USPC ............ 118/723 R, 723 E; 156/345.1, 345.3, 156/345.51; 257/E21.482, E21.485; 438/710, 729, 460, 462, 463, 715, 731; 216/67, 41, 63, 64, 68, 71, 72, 79
  See application file for complete search history.

(56) References Cited

U.S. PATENT DOCUMENTS

| | | | |
|---|---|---|---|
| 5,779,803 A | 7/1998 | Kurono et al. | |
| 8,691,702 B2* | 4/2014 | Geerpuram et al. | 438/731 |
| 8,778,806 B2* | 7/2014 | Johnson | H01L 21/3065 |
| | | | 438/113 |
| 9,034,771 B1* | 5/2015 | Nangoy | 438/710 |
| 2005/0266174 A1* | 12/2005 | Hou | C23C 16/4585 |
| | | | 427/569 |
| 2010/0216313 A1 | 8/2010 | Iwai | |
| 2012/0322239 A1 | 12/2012 | Singh et al. | |
| 2013/0065378 A1 | 3/2013 | Johnson et al. | |
| 2013/0295775 A1* | 11/2013 | Iwai | 438/729 |
| 2014/0017900 A1 | 1/2014 | Doba et al. | |

OTHER PUBLICATIONS

U.S. Office Action issued Oct. 13, 2015 in related U.S. Appl. No. 14/259,559.
Japanese Office Action issued Feb. 23, 2016 in corresponding Japanese Patent Application No. 2013-099291.
Office Action issued Aug. 3, 2016 in related U.S. Appl. No. 14/259,559.

* cited by examiner

PLASMA PROCESSING APPARATUS AND PLASMA PROCESSING METHOD

CROSS-REFERENCE TO RELATED APPLICATIONS

This application claims priority from Japanese Patent Application No. 2013-099291, the disclosures of which are incorporated herein by reference in their entireties.

BACKGROUND OF THE INVENTION

Field of the Invention

The present invention relates to a plasma processing apparatus and a plasma processing method, and particularly to a technique that is effective in plasma processing of a wafer held in a carrier which includes an annular frame and a holding sheet.

Description of Related Art

As a plasma processing apparatus, there is known one disclosed in Japanese Unexamined Patent Application Publication No. 2012-248741. A processing object of the plasma processing apparatus is a wafer that is held in a carrier which includes an annular frame and a holding sheet. When dicing the wafer by plasma, the annular frame is covered by a covering so as not to be exposed to the plasma.

However, the inner diameter of the covering is larger than the outer diameter of the wafer. Therefore, a part of the holding sheet may be exposed to plasma and thereby damaged. Further, the temperature of the covering may become high during the processing, and the holding sheet may be damaged also when being affected by the heat.

SUMMARY OF THE INVENTION

Therefore, it is an object of the present invention to provide a plasma processing apparatus and a plasma processing method capable of preventing an adverse effect on a holding sheet even when performing plasma processing.

In accordance with one aspect of the present invention, there is provided a plasma processing apparatus performing plasma processing on a substrate held in a carrier including an annular frame and a holding sheet, the plasma processing apparatus including:

a chamber having a pressure reducible internal space;

a plasma source generating plasma inside the chamber;

a stage provided inside the chamber, the stage placing the carrier thereon;

a cover arranged above the stage to cover the holding sheet and the frame, the cover having a window formed on a central part thereof to penetrate the cover in the thickness direction; and a drive mechanism changing the position of the cover relative to the stage between a first position away from the stage, the first position allowing the carrier to be placed on and removed from the stage, and a second position allowing the cover to cover the holding sheet and the frame of the carrier placed on the stage and the substrate held on the holding sheet to be exposed through the window, wherein the window of the cover allows an area of the substrate, the area being located on the inner side with respect to an outer edge area of the substrate, to be exposed therefrom.

With this configuration, by limiting an exposed area of the substrate by the window of the cover, the holding sheet is less likely to be exposed to plasma generated inside the chamber. Therefore, damage of the holding sheet such as deformation caused by plasma is prevented.

The cover preferably includes a counterface surface formed on a lower face of an inner edge part forming the window, the counterface surface is opposed to the substrate.

This configuration makes it possible to more appropriately prevent the holding sheet from being exposed to plasma.

The outer edge area of the substrate covered by the cover is preferably within the range of 5 mm or less from an outer edge of the substrate toward the inner side thereof.

In accordance with a second aspect of the present invention, there is provided a plasma processing method including the steps of:

preparing a carrier having a holding sheet and a frame attaching the holding sheet thereto;

holding a substrate on the holding sheet of the carrier;

conveying the carrier into a chamber of a plasma processing apparatus and placing on a stage;

covering the holding sheet and the frame of the carrier by a cover so that an area of the substrate, the area being located on the inner side with respect to an outer edge area of the substrate, is exposed through a window formed on the cover; and generating plasma inside the chamber to perform plasma processing on the substrate exposed through the window.

In the present invention, an exposed area of the substrate is limited by the window formed on the cover. Therefore, the holding sheet is less likely to be exposed to plasma. As a result, it is possible to prevent the holding sheet from being damaged.

DETAILED DESCRIPTION OF THE PREFERRED EMBODIMENT

An embodiment according to the present invention will be described below with reference to the accompanying drawings. In the following description, terms indicating specific directions or positions (terms including "up", "down", "side", and "end", for example) are used as needed. However, these terms are used for easy understanding of the invention with reference to the drawings, and the technical scope of the invention is therefore not limited by meanings of these terms. Further, the following description is merely illustrative in nature and is not intended to limit the invention, its application, or uses.

Figure 3A:
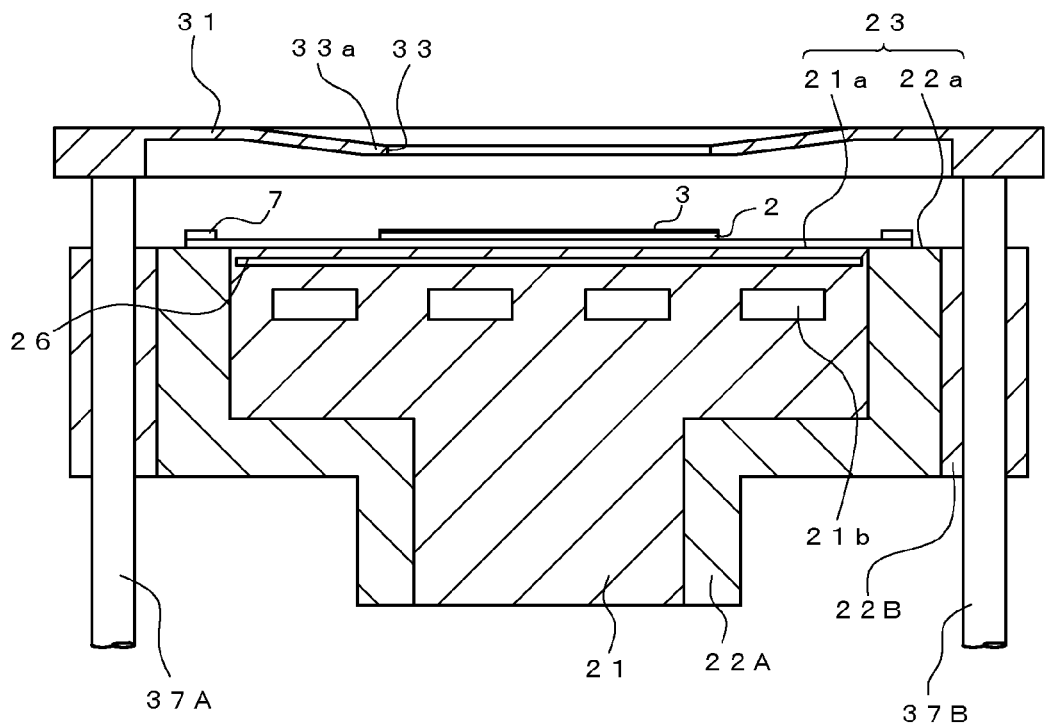
FIG. 3A is a cross-sectional view taken along line A-A of FIG. 2 (raised position)
Figure 3B:
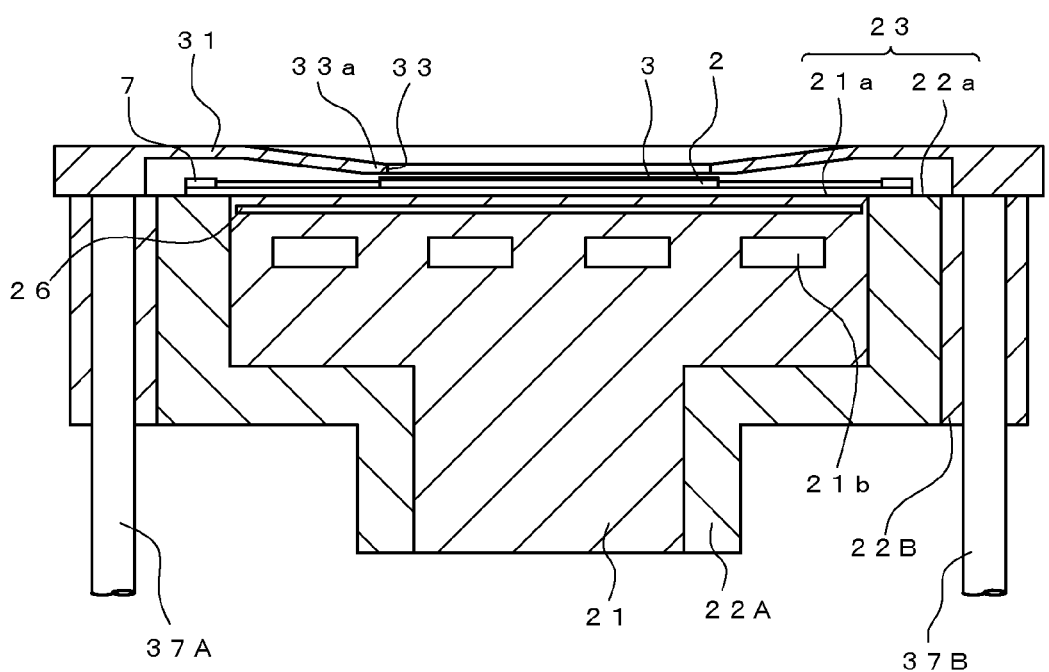
FIG. 3B is a cross-sectional view taken along line A-A of FIG. 2 (lowered position)
Figure 4A:
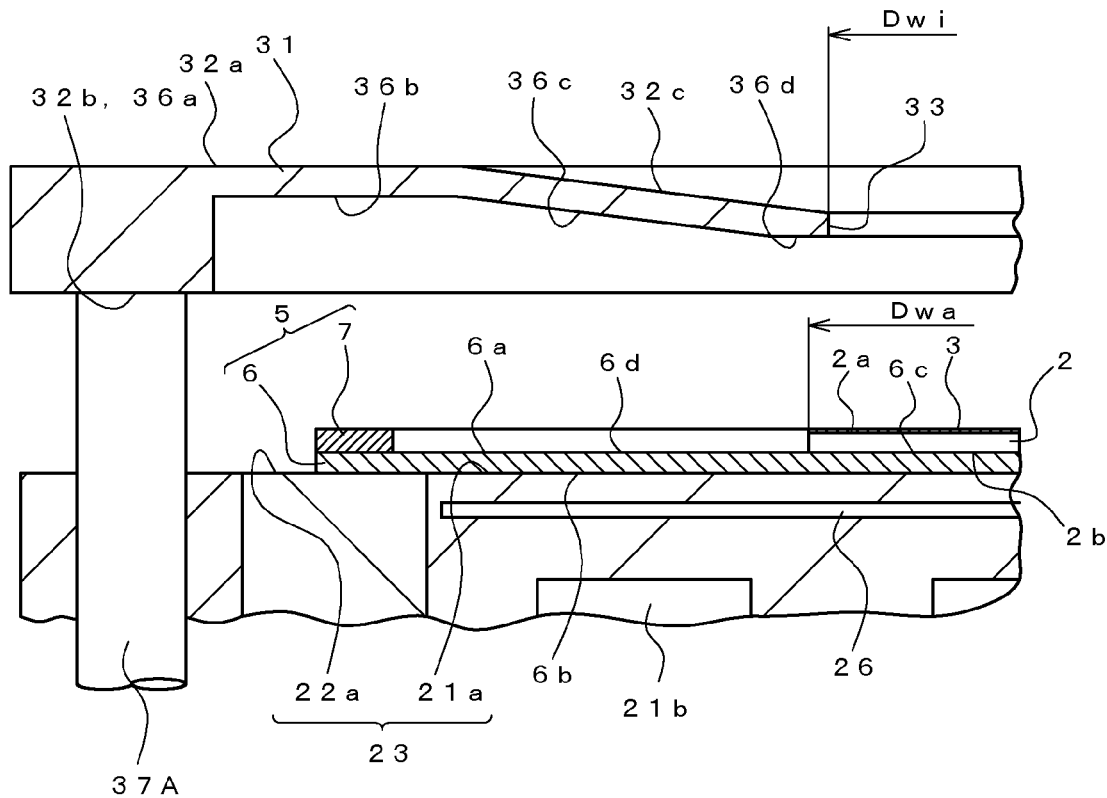
FIG. 4A is a partially enlarged view of FIG. 3A.
Figure 4B:
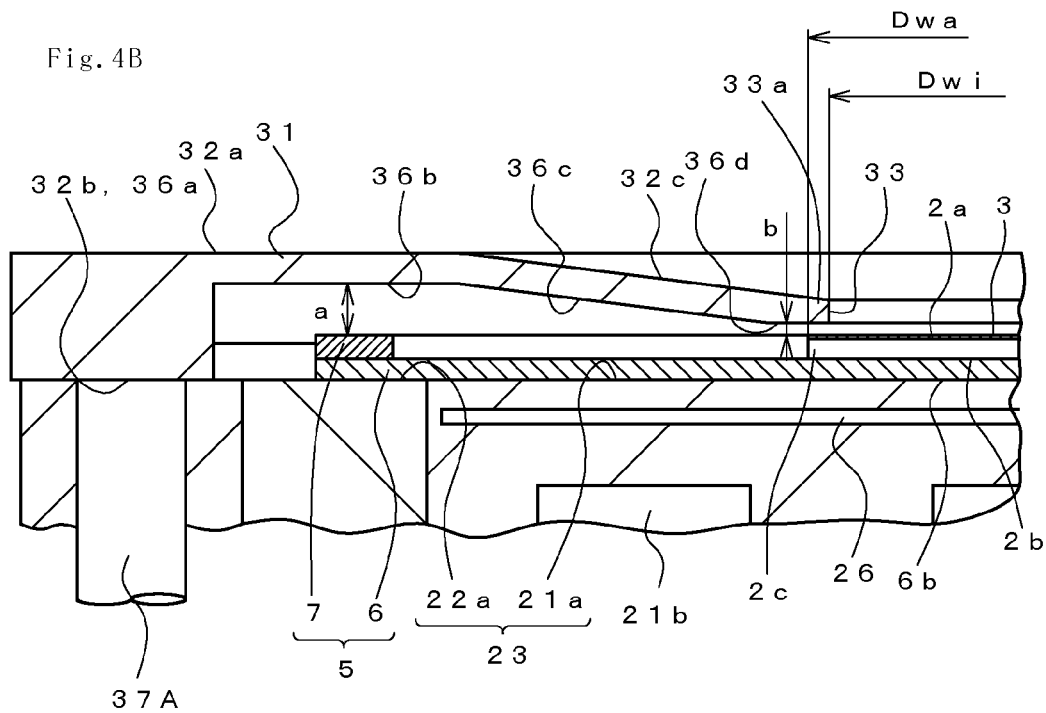
FIG. 4B is a partially enlarged view of FIG. 3B.

FIGS. 1 to 4B illustrate a dry etching apparatus 1 as an example of the plasma processing apparatus according to the embodiment of the present invention. In the present embodiment, plasma dicing and ashing following the plasma dicing are performed on a wafer (substrate) 2 by the dry etching apparatus 1. Plasma dicing is a method in which a wafer having a plurality of ICs (semiconductor devices) formed thereon is cut in boundary lines (streets) using dry etching to divide the wafer into individual ICs. Referring to FIGS. 4A and 4B, the wafer 2 having a circular shape in the present embodiment includes a front face 2a which has ICs (not illustrated) and the like formed thereon and a back face 2b (having no IC) which is located on the opposite side of the front face 2a. A mask 3 is formed on the front face 2a of the wafer 2 in a pattern for plasma dicing.

The dry etching apparatus 1 is provided with a chamber 11 which has a pressure reducible internal space. The chamber 11 can house a carrier 5 in the internal space thereof through a gate (not illustrated). The carrier 5 is provided with a holding sheet 6 which detachably holds the wafer 2. As the holding sheet 6, for example, a so-called UV tape can be used. A UV tape is elastically extendable and holds the wafer 2 by its adhesive power. However, the chemical characteristics of the UV tape change by being exposed to ultraviolet rays, and the adhesive power thereof is thereby considerably reduced. As illustrated in FIG. 4A, one face of the holding sheet 6 has adhesiveness (adhesive face 6a) and the other face thereof does not have adhesiveness (non-adhesive face 6b). The holding sheet 6 is flexible, and therefore easily warps and cannot maintain a fixed shape by only itself. Therefore, a frame (annular frame) 7 which has a generally ring shape and thin thickness is stuck to the adhesive face 6a of the holding sheet 6 near the outer peripheral edge thereof. The frame 7 is made of, for example, metal and has stiffness capable of holding the shape together with the holding sheet 6.

Figure 2:
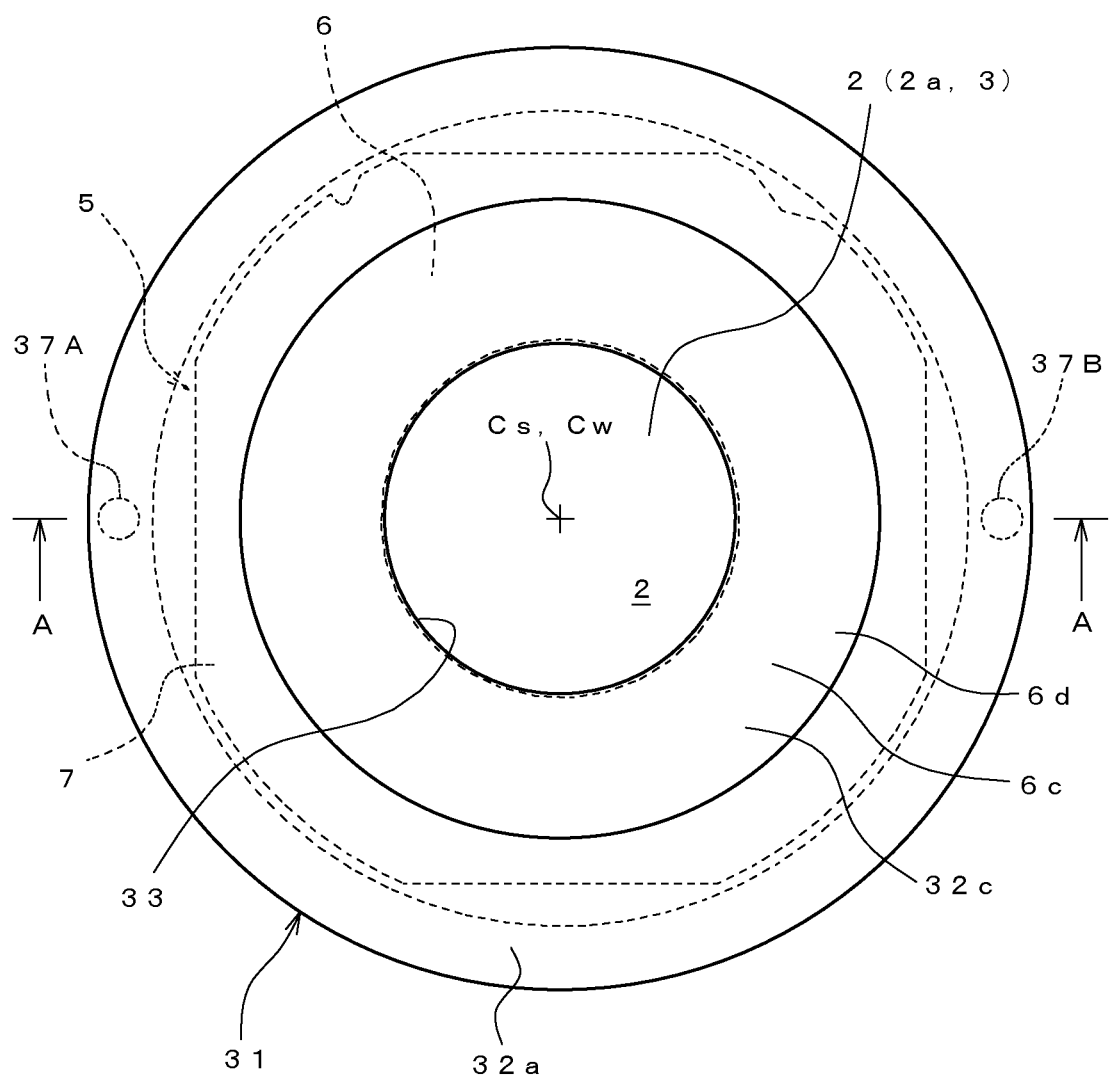
FIG. 2 is a plan view of a cover of the dry etching apparatus illustrated in FIG. 1.

The wafer 2 is held on the holding sheet 6 of the carrier 5 by sticking the back face 2b to the adhesive face 6a. As illustrated in FIG. 2, the wafer 2 is arranged on the center of a circular area 6c which is surrounded by the frame 7 on the adhesive face 6a of the holding sheet 6. Specifically, the position of the wafer 2 relative to the holding sheet 6 is set so that the center Cs of the circular area 6c substantially coincides with the center Cw of the wafer 2 (the center when viewing the wafer 2 from the front face 2a or the back face 2b). By arranging the wafer 2 on the center of the circular area 6c, an annular area 6d having a constant wide width is formed between the wafer 2 and the frame 7 in the holding sheet 6.

Referring to FIGS. 1 to 4B, an antenna (plasma source) 13 as an upper electrode is arranged above a dielectric wall 12 which closes the top of the chamber (vacuum container) 11 of the dry etching apparatus 1. The antenna 13 is electrically connected to a first high frequency power source 14A. On the other hand, a stage unit 16 which places thereon the carrier 5 holding the wafer 2 as descried above is arranged on the bottom of the chamber 11 inside thereof. A process gas source 17 and an ashing gas source 18 are connected to a gas inlet port 11a of the chamber 11. A pressure reducing mechanism 19 which includes a vacuum pump for evacuating the chamber 11 is connected to an exhaust port 11b of the chamber 11.

The stage unit 16 is provided with an electrode unit (second electrode unit) 21 which is electrically connected to a second high frequency power source 14B, a first sheathing unit 22A which surrounds the outer periphery of the electrode unit 21, and a second sheathing unit 22B which surrounds the outer periphery of the first sheathing unit 22A. As will be described below, a part of the electrode unit 21, the part being located near an upper end face 21a thereof and having an electrostatic attraction electrode 26 embedded therein, namely, the uppermost part is made of a dielectric material, and the other part thereof is made of metal. The upper end face 21a of the electrode unit 21 and an upper end face 22a of the first sheathing unit 22A form a placement surface 23 which is a single horizontal surface on which the carrier 5 holding the wafer 2 is placed. The first sheathing unit 22A is made of a dielectric material, and the second sheathing unit 22B is made of a ground shield material (metal having electric conductivity and etching resistivity). The carrier 5 is placed on the stage unit 16 with the adhesive face 6a of the holding sheet 6, the adhesive face 6a holding the wafer 2, facing upward. That is, the non-adhesive face 6b of the holding sheet 6 is placed on the placement surface 23 of the stage unit 16. The carrier 5 is placed on the placement surface 23 of the stage unit 16 by a conveyance mechanism (not illustrated) in a predetermined position/posture (including the rotation angle position around the center Cs of the circular area 6c of the holding sheet 6). Hereinbelow, the predetermined position/posture is described as a normal position.

The dry etching apparatus 1 is provided with a cooling device 24 in the stage unit 16. The cooling device 24 includes a coolant flow path 21b which is formed inside the electrode unit 21 and a coolant circulation device 25 which circulates a temperature-controlled coolant through the coolant flow path 21b.

The electrostatic attraction electrode 26 is embedded in the electrode unit 21 near the upper end face 21a thereof. In the present embodiment, the electrostatic attraction electrode 26 is a monopolar electrode. A direct-current (DC) power source 27 is electrically connected to the electrostatic attraction electrode 26.

A cover 31 which is movable up and down is provided above the placement surface 23 of the stage unit 16 inside the chamber 11. In the following description regarding the cover 31, when referring to the carrier 5 and the wafer 2 held in the carrier 5, the carrier 5 is arranged on the placement surface 23 of the stage unit 16 at the normal position unless otherwise specified.

The cover 31 has a circular external profile and a constant thin thickness. The cover 31 covers the holding sheet 6 and the frame 7 of the carrier 5 to protect them from plasma during plasma processing. Therefore, the cover 31 is formed to be sufficiently larger than the outer profile of the carrier 5. In the present embodiment, the cover 31 is made of, for example, a dielectric material such as ceramics, and has a size that allows the cover 31 to protrude outward from the second sheathing unit 22B.

As illustrated in FIGS. 4A and 4B, a tapered recess 32c is formed on an upper face 32a of the cover 31. The tapered recess 32c is gradually deeper toward the central part of the cover 31. A window 33 which penetrates the cover 31 in the thickness direction from the upper face 32a through a lower face 32b is formed on the central part of the tapered recess 32c. The window 33 has a size and a shape required for preventing the holding sheet 6 on the carrier 5 from being directly exposed to plasma generated in the later-described manner. In the present embodiment, since the wafer 2 has a circular shape, the window 33 is formed into a circular shape corresponding to the shape of the wafer 2. The inner diameter Dwi of the window 33 is smaller than the outer diameter Dwa of the wafer 2.

The cover 31 includes a placement surface 36a which is formed on the lower face 32b from the outer periphery toward the opening (window 33) on the inner periphery thereof. The placement surface 36a is placed on and fixed to the upper end faces of drive rods 37A and 37B. The drive rods 37A and 37B penetrate the second sheathing unit 22B of the stage unit 16 and move the cover 31 up and down. The placement surface 36a of the cover 31 makes surface contact with the upper face of the second sheathing unit 22B at a lowered position (described below). In this surface contact state, when the cover 31 is exposed to plasma and the temperature thereof thereby increases, the heat is released to the second sheathing unit 22B through the surface contact part. That is, the cover 31 is cooled. Further, the inner peripheral face of the cover 31 extends upward from the inner peripheral edge of the placement surface 36a. The cover 31 further includes a ceiling surface 36b which extends from the upper end of the inner peripheral face of the cover 31 toward a space above the inner periphery of the annular frame 7 in parallel to the upper face of the annular frame 7. The cover 31 further includes an inclined surface 36c which extends obliquely downward from the ceiling surface 36b at a part corresponding to the tapered recess 32c with maintaining a substantially constant thickness between the inclined surface 36c and the tapered recess 32c. The cover 31 further includes a counterface surface 36d which extends from the inclined surface 36c in parallel to the upper face of the carrier 5 so as to be closest to the carrier 5.

Figure 1:
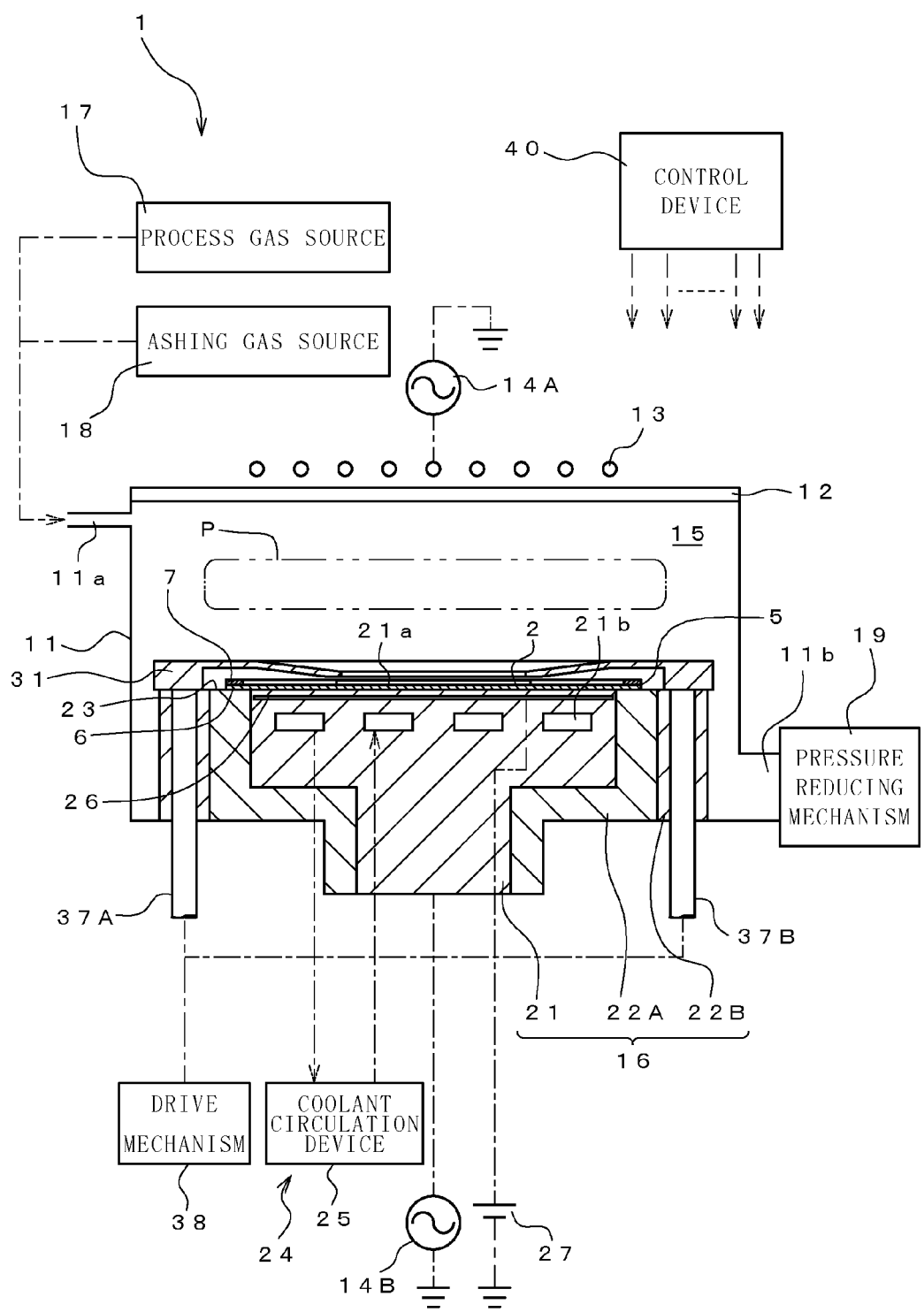
FIG. 1 is a schematic front cross-sectional view of a dry etching apparatus according to an embodiment of the present invention.

The drive rods 37A and 37B are driven to move up and down by a drive mechanism 38 which is conceptually illustrated only in FIG. 1. The cover 31 moves up and down by the up-down movement of the drive rods 37A and 37B. Specifically, the cover 31 is movable to a raised position (first position) illustrated in FIGS. 3A and 4A and the lowered position (second position) illustrated in FIGS. 3B and 4B.

As illustrated in FIGS. 3A and 4A, the cover 31 at the raised position is located above the placement surface 23 of the stage unit 16 with a sufficient space therebetween. Therefore, when the cover 31 is located at the raised position, it is possible to perform an operation of placing the carrier 5 (holding the wafer 2) on the placement surface 23 and, on the contrary, an operation of removing the carrier 5 from the placement surface 23.

As illustrated in FIGS. 3B and 4B, the cover 31 at the lowered position covers the holding sheet 6 (excepting a part holding the wafer 2) and the frame 7 of the carrier 5 located at the normal position. In this case, the ceiling surface 36b of the cover 31 is located with a sufficient space a (5 mm, for example) from the frame 7 to thereby prevent the influence of heat during plasma processing. The inclined surface 36c of the cover 31 ensures a sufficient distance from the holding sheet 6 which is exposed at the inner diameter side of the frame 7. The counterface surface 36d is opposed to the outer peripheral part of the wafer 2, and a space b between the counterface surface 36d and the outer peripheral part of the wafer 2 is sufficiently smaller than the space a. As is clear from the drawings, the cover 31 at the lowered position does not make contact with any of the frame 7, the holding sheet 6 and the wafer 2, and the counterface surface 36d on the inner diameter side thereof comes closest to the carrier 5.

The cover 31 at the lowered position (FIGS. 3B and 4B) allows the wafer 2 which is held on the holding sheet 6 of the carrier 5 located at the normal position to be exposed through the window 33. More specifically, the cover 31 allows an area of the wafer 2, the area being located on the inner side with respect to an outer peripheral area 2c (an area within 5 mm from the outer peripheral edge toward the inner diameter side, for example), to be exposed. The outer peripheral area 2c of the wafer 2 has originally no relation to productization, and is therefore to be discarded. Therefore, by covering the outer peripheral area 2c of the wafer 2 by the cover 31, it is possible to sufficiently suppress the influence of plasma on the holding sheet 6 at the outer peripheral side of the wafer 2. A range of the outer peripheral area 2c of the wafer 2 covered by the cover 31 may be determined by taking into consideration the relationship with the space b between the counterface surface 36d and the wafer 2, that is, the amount of influence of plasma on the holding sheet 6. When making the space b large, although the influence of radiant heat from the cover 31 on the holding sheet 6 can be suppressed, the holding sheet 6 is more likely to be exposed to plasma. On the other hand, when making the space b small, although the holding sheet 6 is less likely to be exposed to plasma, the influence of radiant heat on the holing sheet 6 becomes larger. Therefore, the space b and the range covered by the cover 31 may be determined so that both of the influence of radiant heat and the influence of plasma can be suppressed.

By providing the cover 31 having the above configuration, plasma does not reach the holding sheet 6. That is, failure such as deformation of the holding sheet 6 or welding of the holding sheet 6 to the cover 31 caused by being exposed to plasma and thereby affected by heat is prevented.

The control device 40 schematically illustrated only in FIG. 1 controls operations of components that constitute the dry etching apparatus 1 including the first and second high frequency power sources 14A and 14B, the process gas source 17, the ashing gas source 18, the pressure reducing mechanism 19, the cooling device 24, the DC power source 27, and the drive mechanism 38.

Next, the operation of the dry etching apparatus 1 of the present embodiment will be described.

First, the carrier 5 in which the wafer 2 is stuck to the center of the circular area 6c of the holding sheet 6 is conveyed into the chamber 11 by the conveyance mechanism (not illustrated), and arranged on the placement surface 23 of the stage unit 16 at the normal position. At this point, the cover 31 is located at the raised position (FIGS. 3A and 4A).

Then, the drive rods 37A and 37B are driven by the drive mechanism 38 to lower the cover 31 from the raised position (FIGS. 3A and 4A) to the lowered position (FIGS. 3B and 4B). When the cover 31 is located at the lowered position, the holding sheet 6 and the frame 7 of the carrier 5 are covered by the cover 31, and the wafer 2 is exposed through the window 33. However, the outer peripheral area 2c of the wafer 2 is covered by an inner peripheral edge part 33a of the window 33.

Then, DC voltage is applied to the electrostatic attraction electrode 26 from the DC power source 27 to hold the wafer 2 on the placement surface 23 of the stage unit 16 (the upper end face 21a of the electrode unit 21) by electrostatic attraction.

Further, process gas for plasma dicing is introduced into the chamber 11 from the process gas source 17 and, at the same time, discharged by the pressure reducing mechanism 19 to thereby maintain a processing chamber 15 at a predetermined pressure. Thereafter, high frequency power is supplied to the antenna 13 from the high frequency power source 14A to thereby generate plasma P inside the chamber 11, and the generated plasma P is applied to the wafer 2 exposed through the window 33 of the cover 31. At this point, bias voltage is applied to the electrode unit 21 of the stage unit 16 from the high frequency power source 14B. Further, the stage unit 16 is cooled by the cooling device 24. A part of the wafer 2, the part being exposed from the mask 3 (street), is removed from the front face 2a through the back face 2b by physicochemical action of radicals and ions in the plasma P, so that the wafer 2 is divided into individual chips.

After completing the plasma dicing, ashing is performed. Process gas for ashing (oxygen gas, for example) is introduced into the chamber 11 from the ashing gas source 18 and, at the same time, discharged by the pressure reducing mechanism 19 to thereby maintain the processing chamber 15 at a predetermined pressure. Thereafter, high frequency power is supplied to the antenna 13 from the high frequency power source 14A to thereby generate plasma P inside the chamber 11, and the generated plasma P is applied to the wafer 2 exposed through the window 33 of the cover 31. The mask 3 is completely removed from the front face 2a of the semiconductor wafer 2 by the application of the oxygen plasma P.

After the ashing, the drive rods 37A and 37B are driven by the drive mechanism 38 to move the cover 31 from the lowered position to the raised position. Then, the carrier 5 is conveyed to the outside of the chamber 11 by the conveyance mechanism (not illustrated).

During the plasma processing, the cover 31 is located at the lowered position, and the plasma P is applied to the wafer 2 exposed through the window 33. However, the plasma P is applied only to the inner diameter side of the wafer 2 excepting the outer peripheral area 2c covered by the cover 31. Therefore, a part of the holding sheet 6 (in particular, the inner peripheral part of the annular area 6d), the part being located on the outer diameter side with respect to the outer peripheral area 2c of the wafer 2, is not exposed to the plasma P. Therefore, deformation or deterioration of the holding sheet 6 caused by heat can be prevented. It is needless to say that deterioration of the efficiency of etching the wafer 2 due to the concentration of plasma P on the frame 7 does not occur.

Further, during the plasma processing, the sufficient space a is provided between the ceiling surface 36b of the cover 31 at the lowered position and the frame 7 of the carrier 5. Therefore, the influence of radiant heat from the cover 31 to the frame 7 can be sufficiently suppressed.

Also in the tapered recess 32c of the cover 31, since the inclined surface 36c is formed, a sufficient distance can be ensured also between the cover 31 and the holding sheet 6. Therefore, the holding sheet 6 is prevented from being deformed and stuck to the cover 31 due to radiant heat from the cover 31.

Further, as described above, the space b between the outer peripheral edge of the wafer 2 and the inner peripheral edge part 33a of the window 33 formed on the cover 31 is determined depending on the relationship with the range covered by the cover 31 in order to suppress both of the influence of radiant heat and the influence of plasma. Therefore, the range covering the wafer 2 is prevented from being too wide, thereby preventing the generation of a production part to be wastefully discarded. Further, the holding sheet 6 is prevented from being exposed to plasma and thereby damaged.

The generated plasma P smoothly flows along the upper face of the tapered recess 32c toward the outer diameter side. Therefore, the plasma P is prevented from staying in the window 33 of the cover 31 and flowing toward the holding sheet 6.

Note that the present invention is not limited to the configuration described in the above embodiment, and various modifications can be made therein.

The cover 31 according to the present embodiment is made of a single material in its entirety. However, for example, the cover 31 may be a complex formed by combining a material having excellent thermal resistance and a material having excellent thermal conductivity.

The drive mechanism 38 of the present embodiment moves the cover 31 up and down relative to the stage unit 16 through the drive rods 37A and 37B. However, the drive mechanism 38 may move the stage unit 16 up and down relative to the cover 31 fixed inside the chamber 11.

Further, the electrostatic attraction electrode 26 is not limited to a monopolar electrode as in the present embodiment, and may also be a bipolar electrode.

Further, processing performed by the dry etching apparatus 1 is not limited to plasma dicing and ashing, and may also be, for example, general dry etching. Further, the dry etching apparatus 1 is not limited to an ICP type dry etching apparatus as in the above embodiment, and may also be a parallel-plate type dry etching apparatus. Further, the present invention is not limited to a dry etching apparatus, and can also be applied to another plasma processing apparatus such as a CVD apparatus.

What is claimed is:

1. A plasma processing method, comprising the steps of:
preparing a carrier having a holding sheet and a frame attaching the holding sheet thereto;
holding a substrate on the holding sheet of the carrier;
conveying the carrier into a chamber of a plasma processing apparatus and placing the carrier on a stage;
covering the holding sheet, the frame, and an outer edge area of the substrate by a cover so that an area of the substrate, the area being located on an inner side with respect to the outer edge area of the substrate, is exposed through a window formed on the cover; and
generating plasma inside the chamber to perform plasma processing on the substrate exposed through the window, wherein
the cover is free from contact with any of the frame, the holding sheet, and the substrate during the plasma processing,
the cover is cooled during the plasma processing,
the stage is cooled during the plasma processing, and
the cover is in contact with the stage during the plasma processing so that heat generated in the cover is transferred to the stage.

2. A plasma processing method, comprising the steps of:
preparing a carrier having a holding sheet and a frame attaching the holding sheet thereto;
holding a substrate on the holding sheet of the carrier;
conveying the carrier into a chamber of a plasma processing apparatus and placing the carrier on a stage;
covering the holding sheet, the frame, and an outer edge area of the substrate by a cover so that an area of the substrate, the area being located on an inner side with respect to the outer edge area of the substrate, is exposed through a window formed on the cover; and
generating plasma inside the chamber to perform plasma processing on the substrate exposed through the window, wherein
a lower surface of the cover is facing vertically toward an upper surface of the outer edge area of the substrate with a gap therebetween during the plasma processing,
the cover is cooled during the plasma processing,
the stage is cooled during the plasma processing, and
the cover is in contact with the stage during the plasma processing so that heat generated in the cover is transferred to the stage.

* * * * *